United States Patent
Cheng et al.

(10) Patent No.: US 11,004,784 B2
(45) Date of Patent: May 11, 2021

(54) METAL-ON-METAL CAPACITOR

(71) Applicant: QUALCOMM Incorporated, San Diego, CA (US)

(72) Inventors: Haitao Cheng, San Diego, CA (US); Ye Lu, San Diego, CA (US); Chao Song, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/158,742

(22) Filed: Oct. 12, 2018

(65) Prior Publication Data

US 2020/0118921 A1  Apr. 16, 2020

(51) Int. Cl.
| | |
|---|---|
| *H01L 23/52* | (2006.01) |
| *H01L 23/522* | (2006.01) |
| *H01L 23/58* | (2006.01) |
| *H01G 4/06* | (2006.01) |
| *H01L 49/02* | (2006.01) |

(52) U.S. Cl.
CPC ........... *H01L 23/5223* (2013.01); *H01G 4/06* (2013.01); *H01L 23/585* (2013.01); *H01L 28/88* (2013.01); *H01L 28/91* (2013.01)

(58) Field of Classification Search
CPC ......... H01L 2924/0002; H01L 23/5223; H01L 2924/00; H01L 27/0805; H01L 28/60
See application file for complete search history.

(56) References Cited

U.S. PATENT DOCUMENTS 8,330,251 B2 * 12/2012 Chang ................. H01L 23/5223
257/307

* cited by examiner

*Primary Examiner* — Tony Tran
(74) *Attorney, Agent, or Firm* — Patterson & Sheridan, L.L.P.

(57) ABSTRACT

Certain aspects of the present disclosure provide a metal-on-metal (MoM) capacitor with metal layers, each layer having two different electrical conductors with orthogonally-arranged conductive arteries and orthogonally-oriented conductive fingers. One exemplary MoM capacitor generally includes a plurality of metal layers, wherein a first metal layer in the plurality of metal layers comprises a first electrical conductor providing a first node of the MoM capacitor and a second electrical conductor providing a second node of the MoM capacitor. According to aspects, the first electrical conductor comprises a first plurality of conductive fingers and the second electrical conductor comprises a second plurality of conductive fingers. Further, conductive fingers of the first plurality of conductive fingers are interdigitated with conductive fingers of the second plurality of conductive fingers. Additionally, the first electrical conductor in the first metal layer is oriented orthogonal to the second electrical conductor in the first metal layer.

20 Claims, 7 Drawing Sheets

702 — FORM A FIRST METAL LAYER COMPRISING A FIRST ELECTRICAL CONDUCTOR PROVIDING A FIRST NODE OF A MoM CAPACITOR AND A SECOND ELECTRICAL CONDUCTOR PROVIDING A SECOND NODE OF THE MoM CAPACITOR,
WHEREIN: THE FIRST ELECTRICAL CONDUCTOR COMPRISES A FIRST PLURALITY OF CONDUCTIVE FINGERS; THE SECOND ELECTRICAL CONDUCTOR COMPRISES A SECOND PLURALITY OF CONDUCTIVE FINGERS; CONDUCTIVE FINGERS OF THE FIRST PLURALITY OF CONDUCTIVE FINGERS ARE INTERDIGITATED WITH CONDUCTIVE FINGERS OF THE SECOND PLURALITY OF CONDUCTIVE FINGERS; AND THE FIRST ELECTRICAL CONDUCTOR IN THE FIRST METAL LAYER IS ORIENTED ORTHOGONAL TO THE SECOND ELECTRICAL CONDUCTOR IN THE FIRST METAL LAYER

704 — STACK AT LEAST A SECOND METAL LAYER ABOVE THE FIRST METAL LAYER, SUCH THAT THE MoM CAPACITOR COMPRISES A PLURALITY OF METAL LAYERS

FIG. 7

METAL-ON-METAL CAPACITOR

FIELD OF THE DISCLOSURE

The present disclosure generally relates to electronic components, and more particularly to metal-on-metal (MOM) capacitors for use in integrated circuits.

DESCRIPTION OF RELATED ART

Advances in technology have resulted in smaller and more powerful computing devices. The prevalence of these computing devices is driven in part by the many functions that are now enabled on such devices. Demand for such functions increases processing capability requirements and, in some cases, generates a need for more powerful batteries. Within the limited space of the housing of these computing devices, batteries compete with the processing circuitry. These and other factors contribute to a continued miniaturization of components within the circuitry.

Miniaturization of the components impacts all aspects of the processing circuitry including the transistors and other reactive elements in the processing circuitry, such as capacitors. One miniaturization technique involves moving some reactive elements from the printed circuit board into the integrated circuitry. One technique for moving reactive elements into the integrated circuitry involves creating metal-on-metal (MoM) capacitors during back end of line (BEOL) integrated circuit fabrication.

BRIEF SUMMARY

Aspects of the present disclosure provide a metal-on-metal (MoM) capacitor having two different electrical conductor structures comprising orthogonally-arranged conductive arteries and orthogonally-oriented conductive fingers. An exemplary MoM capacitor generally includes a plurality of metal layers, wherein a first metal layer in the plurality of metal layers comprises a first electrical conductor providing a first node of the MoM capacitor and a second electrical conductor providing a second node of the MoM capacitor. According to aspects, the first electrical conductor comprises a first plurality of conductive fingers and the second electrical conductor comprises a second plurality of conductive fingers. Further, conductive fingers of the first plurality of conductive fingers are interdigitated with conductive fingers of the second plurality of conductive fingers. Additionally, the first electrical conductor in the first metal layer is oriented orthogonal to the second electrical conductor in the first metal layer.

Certain aspects of the present disclosure are directed to a method for fabricating a MoM capacitor. The method generally includes forming a first metal layer comprising a first electrical conductor providing a first node of the MoM capacitor and a second electrical conductor providing a second node of the MoM capacitor; and stacking at least a second metal layer above the first metal layer, such that the MoM capacitor comprises a plurality of metal layers. In this case, the first electrical conductor comprises a first plurality of conductive fingers; the second electrical conductor comprises a second plurality of conductive fingers; conductive fingers of the first plurality of conductive fingers are interdigitated with conductive fingers of the second plurality of conductive fingers; and the first electrical conductor in the first metal layer is oriented orthogonal to the second electrical conductor in the first metal layers.

Other aspects, advantages, and features of the present disclosure will become apparent after review of the entire application, including the following sections: Brief Description of the Drawings, Detailed Description, and the Claims.

DETAILED DESCRIPTION

With reference now to the figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Current back end of line (BEOL) metal-on-metal (MoM) capacitors use a two-element interdigitated structure, which has proven acceptable for devices in which the space between electrodes is forty nanometers (40 nm) or greater. Such capacitors are created using masks and metal deposition processes. Currently known lithography processes allow a space of approximately as small as forty (40) nm between electrodes while using a single mask process. However, miniaturization-focused designers are now trying to create circuits with electrodes with even smaller spaces, such as, for example, thirty-two (32) nm or smaller. When the space between conductive elements is this small, it is problematic for a single mask to provide both elements of the interdigitated structure. As a result, for these small line spaces, current processes use two masks to create the interdigitated structure. In such processes, a substrate is provided and the first mask is positioned thereon. A metal deposition technique is used to generate the first conductive element. The first mask is then removed, and a second mask is applied that covers the just-created first conductive element. A metal deposition technique is used to generate the second conductive element. Unfortunately, the use of two masks may result in misalignment of the second conductive element relative to the first conductive element and corresponding variations in the capacitances of resulting capacitive devices. While some process and resulting capacitance variations are tolerable, current capacitance variations from such varying processes may exceed design parameters, and a better process is needed.

Aspects of the present disclosure include metal-on-metal (MoM) capacitors composed of multiple metal layers, each metal layer having two different electrical conductors with orthogonally-arranged conductive arteries and orthogonally-oriented conductive fingers. However, before discussing such MoM capacitors, a brief overview of a conventional MoM capacitor is provided with reference to FIG. 1. The discussion of exemplary aspects of MoM capacitors having two different electrical conductors with orthogonally-arranged conductive arteries and orthogonally-oriented conductive fingers begins below with reference to FIG. 3.

Figure 1:
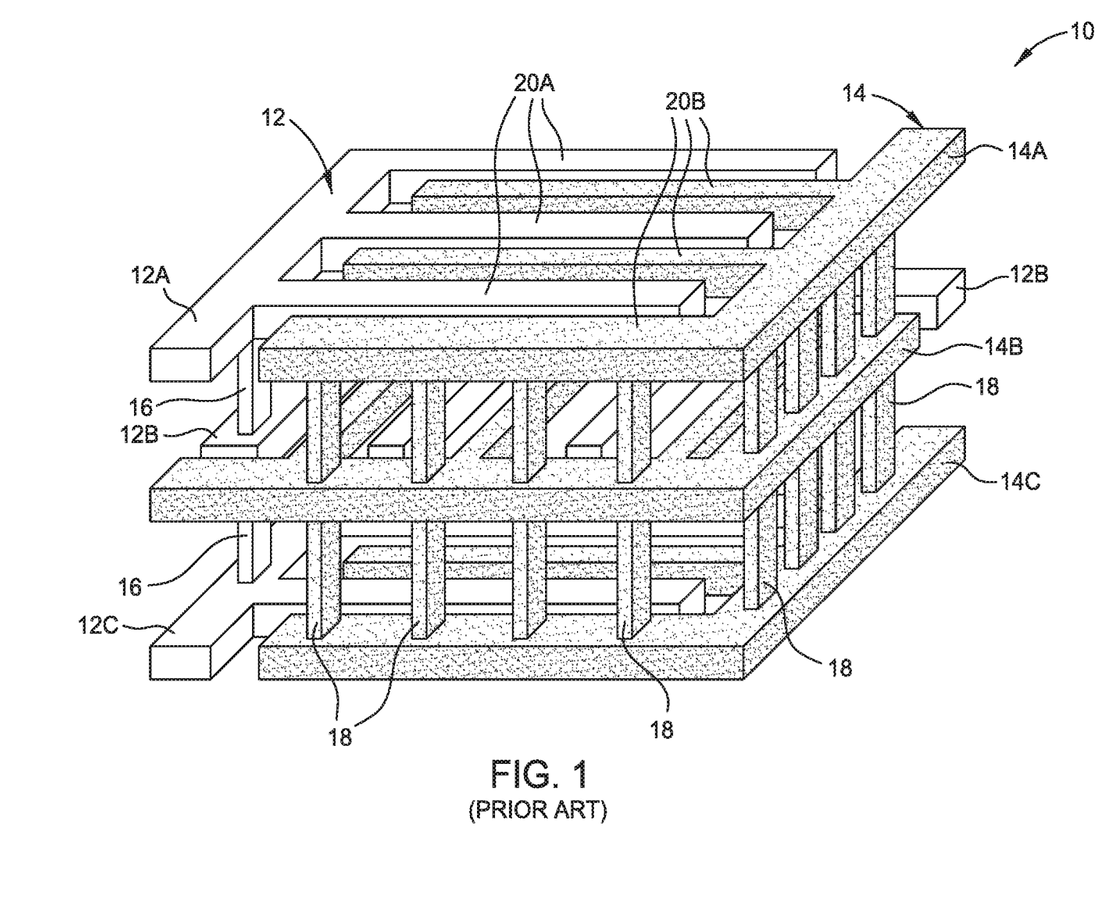
FIG. 1 is a diagram of a conventional metal-on-metal (MoM) capacitor.

In this regard, FIG. 1 illustrates a conventional MoM capacitor 10. The MoM capacitor 10 has an interdigitated double patterning structure with metal fingers interdigitated. The existence of these fingers causes the MoM capacitor 10 to also be referred to as a Finger Metal-on-Metal capacitor (FMoM). As used herein, the term "finger" refers to the generally rectilinear element of a node that is interdigitated with other similar generally rectilinear elements. The MoM capacitor 10 is formed from two nodes. The first node of the MoM capacitor 10 is a first conductive element 12 (formed from elements 12A, 12B, and 12C). The second node of the MoM capacitor 10 is a second conductive element 14 (formed from elements 14A, 14B, and 14C). The various elements 12A, 12B, and 12C of first conductive element 12 are electrically coupled to one another with vias 16. Similarly, the various elements 14A, 14B, and 14C of second conductive element 14 are electrically coupled to one another with vias 18. Each of the elements 12A, 12B, and 12C includes a first set of metal fingers 20A. Similarly, each of the elements 14A, 14B, and 14C includes a second set of metal fingers 20B, which, as shown, are interdigitated with the metal fingers 20A of the elements 12A, 12B, and 12C.

As illustrated in FIG. 1, the elements 12A, 12B, and 12C are vertically stacked relative to one another. The elements 12A, 12B, and 12C are also designed to be directly disposed over one another so that the vias 16 are aligned. The elements 12A, 14A are disposed in a first metal layer. Likewise, elements 12B and 14B are disposed in a second metal layer arranged below the first metal layer, and elements 12C and 14C are disposed in a third metal layer arranged below the second metal layer. It should be appreciated that the layers in the MoM capacitor 10 are rotated ninety degrees relative to adjacent layers. That is, the layer with elements 12A and 14A is rotated ninety degrees relative to layer with elements 12B and 14B, which is rotated ninety degrees relative to the layer with elements 12C and 14C.

With continuing reference to FIG. 1, due to certain errors in the manufacturing process of MoM capacitors, a misalignment in the double patterning finger structure may occur, causing variance in capacitance. For example, during the manufacture process of the MoM capacitor 10, two separate lithography masks are used to fabricate the two sets of metal fingers 20A and 20B. However, many times misalignment in one or more of an x-direction or a y-direction of an x-y plane may occur between the two sets of metal fingers 20A and 20B, as explained in greater detail below with reference to FIGS. 2A-2C.

Figure 2A:
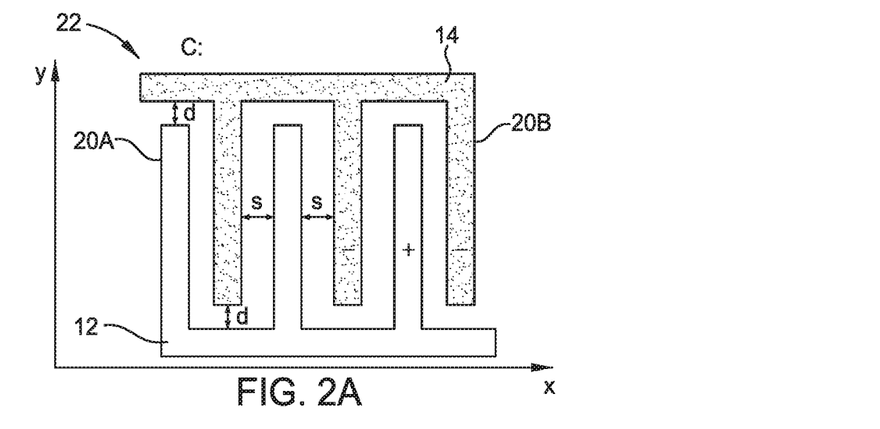
FIG. 2A illustrates a layer of a conventional MoM capacitor having spacings between conductive fingers in the x- and y-directions of an x-y plane.

FIG. 2A illustrates a two-dimensional representation of a single layer 22 of the MoM capacitor 10 illustrated in FIG. 1 on an x-y plane. As illustrated, the layer 22 of the MoM capacitor 10 illustrated in FIG. 2A includes conductive elements 12 and 14 with interdigitated sets of metal fingers 20A and 20B. As shown, the conductive element 12 is positioned near the bottom of the single layer 22, adjacent to the x-axis in FIG. 2A. Further, as illustrated, the conductive element 14 may be considered as an opposing version of the conductive element 12. For example, as illustrated, a structure of the conductive element 14 may be substantially the same as a structure of the conductive element 12, and the conductive element 14 may effectively be considered as a version of conductive element 12 rotated 180 degrees in the single layer 22 and shifted slightly such that the metal fingers 20A and the metal fingers 20B are interdigitated. Thus, the metal fingers 20A and 20B are parallel (or could be considered as being anti-parallel since the fingers extend in opposite directions).

As illustrated in FIG. 2, an x-directional spacing, S, is maintained between each finger of the interdigitated sets of metal fingers 20A and 20B and an adjacent finger. In some cases, S may be equal to 100 nanometers (nm). Additionally, a y-directional spacing, d, is maintained between each finger of the interdigitated sets of metal fingers 20A and 20B and an opposing conductive element 12 or 14. More specifically, a y-directional spacing, d, is maintained between each finger of the first set of metal fingers 20A and the conductive element 14. Likewise, a y-directional spacing, d, is maintained between each finger of the second set of metal fingers 20B and the conductive element 12.

Figure 2B:
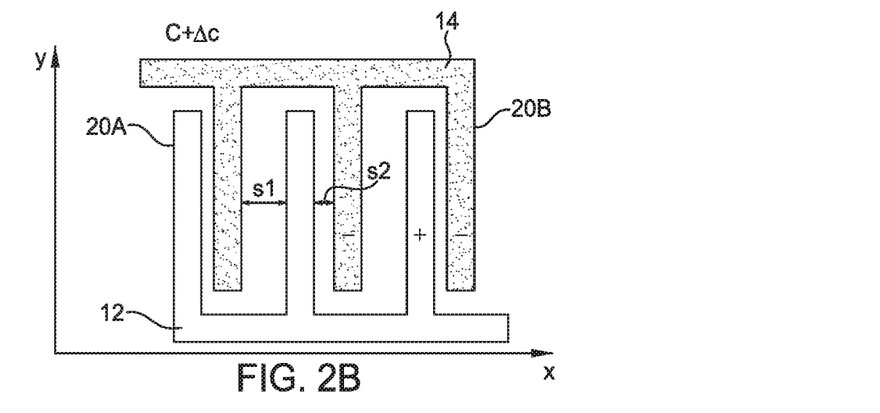
FIG. 2B illustrates x-direction misalignment between conductive fingers of a conventional MoM capacitor in an x-y plane.
Figure 2C:
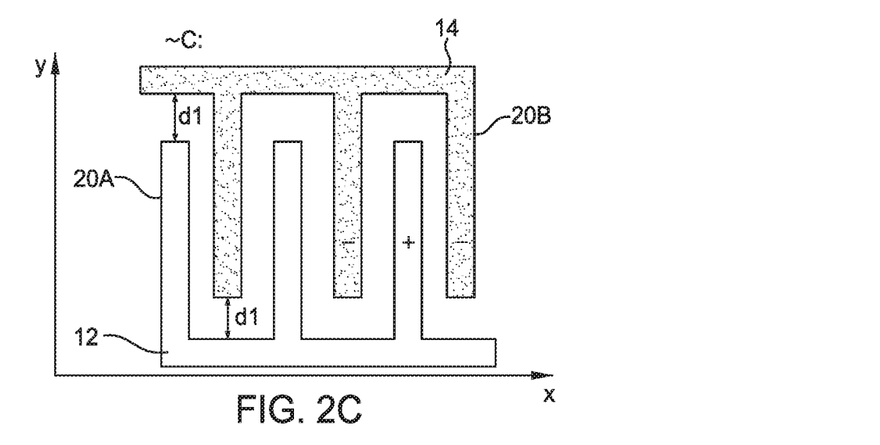
FIG. 2C illustrates y-direction misalignment between conductive fingers of a conventional MoM capacitor in an x-y plane.

As noted above, due to certain errors in the double patterning manufacturing process of the MoM capacitor 10, misalignment in an x-direction and/or a y-direction may occur between the interdigitated sets of metal fingers 20A and 20B. For example, FIG. 2B illustrates a misalignment between fingers in an x-direction, resulting in unequal x-directional spacings, $s_1$ and $s_2$ (e.g., $s_1$=60 nm and s2=40 nm). In some cases, this x-directional misalignment results in a capacitance equal to C+Δc, where C is the nominal capacitance and Δc is the variance (i.e., the error). Similarly, as illustrated in FIG. 2C, a y-directional misalignment between fingers may occur during the fabrication process, resulting in y-directional spacing (e.g., d1) outside of an acceptable value. However, this y-directional misalignment may be relatively small compared to the overall length of the fingers 20A, 20B and, thus, may not affect the capacitance much. Consequently, this y-directional misalignment may result in a capacitance approximately equal to the capacitance in FIG. 2A (i.e., ~C), albeit with some variance. Such misalignments in the x-directional and/or y-directional spacings may result in capacitors with capacitance tolerances that fall outside design constraints.

Thus, aspects of the present disclosure provide a MoM capacitor that reduces variance in capacitance due to misalignment during the double patterning manufacturing process. For example, aspects of the present disclosure provide a MoM capacitor with layers comprising orthogonally arranged electrical conductors within each layer. More specifically, MoM capacitors according to the aspects described herein include a plurality of vertically-stacked (e.g., in a z-direction perpendicular to the x-y plane) conductive metal layers, each including a plurality of orthogonally-arranged conductive arteries and a plurality of orthogonally-oriented interdigitated conductive fingers. Orthogonally-arranged conductive arteries and orthogonally-oriented interdigitated conductive fingers in a layer of a MoM capacitor may minimize, or at least reduce, the cumulative effects of misalignment in the double patterning manufacturing process on capacitance variance (e.g., by as much as 50%). As a result, the variances of capacitors made according to aspects presented herein are relatively small, in effect, making more reliably uniform capacitors (e.g., lower capacitance tolerance).

Figure 3:
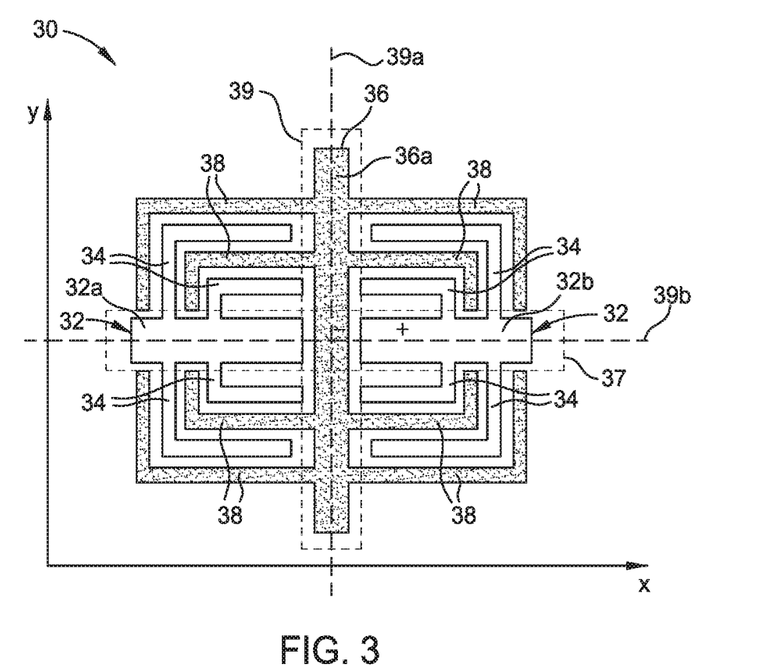
FIG. 3 illustrates a layer of a MoM capacitor having two different electrical conductors with orthogonally-arranged conductive arteries and orthogonally-oriented conductive fingers, according to aspects presented herein.

In this regard, an exemplary two-dimensional representation of a metal layer 30 of a MoM capacitor having orthogonally-arranged electrical conductors in the layer is illustrated in FIG. 3. For example, as illustrated, the layer 30 of the MoM capacitor includes a first electrical conductor 32 and a second electrical conductor 36. The first electrical conductor 32 is composed of two conductive arteries, a first conductive artery 32a and a second conductive artery 32b, which, collectively, provide a first node 37 for the MoM capacitor, illustrated in FIG. 3 as a positive node. Additionally, the second electrical conductor 36 is composed of a third conductive artery 36a that provides a second node 39 for the MoM capacitor, illustrated in FIG. 3 as a negative node. While FIG. 3 illustrates the first node 37 as a positive node and the second node 39 as a negative node, it should be understood that the polarities of these nodes are agnostic. That is, the first node 37 may alternatively have a negative polarity, and the second node 39 may have a positive polarity.

As illustrated in FIG. 3, the first electrical conductor 32 of the metal layer 30 is oriented orthogonal to the second electrical conductor 36. That is, as illustrated in FIG. 3, a longitudinal axis 39a of the third conductive artery 36a of the second electrical conductor 36 is orthogonal to a longitudinal axis 39b of at least one of the first conductive artery 32a or the second conductive artery 32b. Further, as illustrated, the first conductive artery 32a is positioned adjacent to a first side of the third conductive artery 36a of the second electrical conductor 36 and the second conductive artery 32b is positioned adjacent to a second side of the third conductive artery 36a of the second electrical conductor 36, opposite to the first side.

As illustrated, first electrical conductor 32 includes a first plurality of conductive fingers 34 extending from the conductive arteries 32a and 32b of the first electrical conductor 32. For example, the first plurality of conductive fingers 34 may comprise a first set of conductive fingers and a second set of conductive fingers. According to aspects, the first set of conductive fingers may extend from a first side of the first conductive artery 32a (e.g., a top side of the first conductive artery 32a as illustrated in FIG. 3) in an L-shape. Additionally, the second set of conductive fingers may extend from a second side of the first conductive artery 32a that is opposite to the first side of the first conductive artery 32a (e.g., a bottom side of the artery 32a as illustrated in FIG. 3) in an L-shape. Together, each finger in the first and second sets of conductive fingers can be considered as C-shaped (i.e., two L-shaped fingers in combination form a C-shape). Additionally, the first plurality of conductive fingers 34 may comprise a third set of conductive fingers and a fourth set of conductive fingers. According to aspects, the third set of conductive fingers and the fourth set of conductive fingers may extend from the second conductive artery 32b to form a mirror image of the first conductive artery 32a, the first set of conductive fingers, and the second set of conductive fingers. For example, as illustrated in FIG. 3, a mirror image, comprising the second conductive artery 32b, the third set of conductive fingers, and the fourth set of conductive fingers, may be formed by mirroring the first conductive artery 32a, the first set of conductive fingers, and the second set of conductive fingers across the longitudinal axis 39a.

Similarly, the second electrical conductor 36 includes a second plurality of conductive fingers 38 that includes conductive fingers that extend from the conductive third artery of the second electrical conductor 36 and that are interdigitated with the conductive fingers of the first plurality of conductive fingers 34. For example, the second plurality of conductive fingers 38 may comprise a first set of conductive fingers and a second set of conductive fingers. According to aspects, the first set of conductive fingers of the second plurality of conductive fingers 38 may extend from a first side of the third conductive artery 36a (e.g., a left side of the conductive artery of the second electrical conductor 36 as illustrated in FIG. 3) in an L-shape. Additionally, the second set of conductive fingers of the second plurality of conductive fingers 38 may extend from a second side of the third conductive artery 36a that is opposite to the first side of the third conductive artery 36a (e.g., a right side of the conductive artery of the second electrical conductor 36 as illustrated in FIG. 3) in an L-shape. Additionally, the second plurality of conductive fingers 38 may comprise a third set of conductive fingers and a fourth set of conductive fingers. According to aspects, the third set of conductive fingers of the second plurality of conductive fingers 38 and the fourth set of conductive fingers of the second plurality of conductive fingers 38 may extend from the third conductive artery 36a to form a mirror image of the first set of conductive fingers of the second plurality of conductive fingers 38 and the second set of conductive fingers of the second plurality of conductive fingers 38. For example, as illustrated in FIG. 3, a mirror image, comprising the third set of conductive fingers of the second plurality of conductive fingers 38 and the fourth set of conductive fingers of the second plurality of conductive fingers 38 extending from the third conductive artery 36a, may be formed by mirroring a first portion of the third conductive artery 36a (e.g., above the longitudinal axis 39b), the first set of conductive fingers of the second plurality of conductive fingers 3, and the second set of conductive fingers of the second plurality of conductive fingers 3 across the longitudinal axis 39b.

Figure 3A:
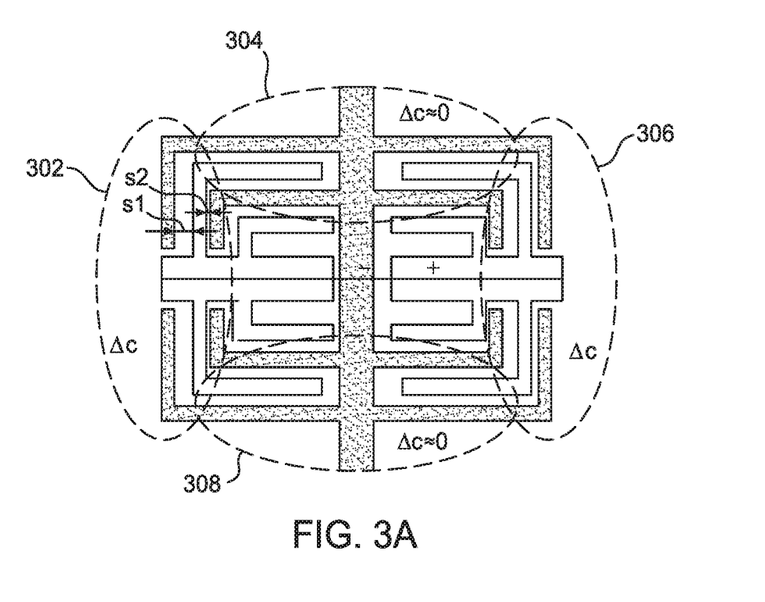
FIG. 3A illustrates a reduced capacitance variance for MoM capacitors disclosed herein compared to conventional MoM capacitors.

According to aspects, a MoM capacitor having orthogonally-arranged electrical conductors in its layers may reduce capacitance variance by as much as half compared to traditional MoM capacitors. An illustration of this reduction in capacitance variance is shown in FIG. 3A. For example, FIG. 3A shows a reduction in capacitance variance when there is a misalignment in an x-direction between the interdigitated fingers in a layer of a MoM capacitor. For example, for illustrative purposes, the layer of the MoM capacitor may be split up into four different regions: 302, 304, 306, and 308. As illustrated, the variance in capacitance for the region 302 may be equal to $\Delta c$, which is due to the unequal x-directional spacings, $s_1$ and $s_2$ (e.g., $s_1$=60 nm and s2=40 nm). Likewise, region 306 maintains the same variance in capacitance, $\Delta c$, as region 302 due to similar unequal x-directional spacings between fingers. However, as illustrated, regions 304 and 308 have a variance in capacitance equal to $\Delta c \approx 0$, which is due to the fact that the spacings between the interdigitated fingers in these regions are roughly equal. Thus, as can be seen, the overall variance in capacitance may be reduced by half, or $0.5\Delta c/c$ since only two (e.g., 302 and 306) of the four regions have a variance in capacitance equal to $\Delta c$.

Additionally, while not illustrated in FIG. 3A, when there is a misalignment in a y-direction between the interdigitated fingers in the layer of a MoM capacitor, the variance in capacitance is also reduced by half. For example, with reference to FIG. 3A, this scenario would lead to the regions 304 and 308 having a variance in capacitance equal to $\Delta c$ and regions 302 and 306 having a variance in capacitance equal to $\Delta c \approx 0$. Thus, the variance in capacitance in this scenario is also reduced by half, or $0.5\Delta c/c$.

According to aspects, when there is a misalignment in both the x and y directions between the interdigitated fingers in the layer of a MoM capacitor, the variance in capacitance may be equal to $\Delta c$. However, this scenario occurs with a much lower probability. For example, assume that the probability of misalignment in the x direction is equal to $P_1$ (e.g., 10%) and that the probability of misalignment in the y direction is equal to $P_2$ (e.g., 10%). Thus, the probability of there being a misalignment in both the x and y directions may be equal to $P_1*P_2$. For example, assuming $P_1$=10% and $P_2$=10%, the probability of misalignment in both the x and y directions would be equal to 10%*10%, or 1%, which is much smaller than the 11% chance of misalignment in both the x and y directions for conventional MoM capacitors. Thus, while a variance in capacitance for the MoM capacitor disclosed herein may equal $\Delta c$ when there is a misalignment in both the x and y directions, this type of misalignment occurs at a much lower probability than conventional MoM capacitors.

Figure 4:
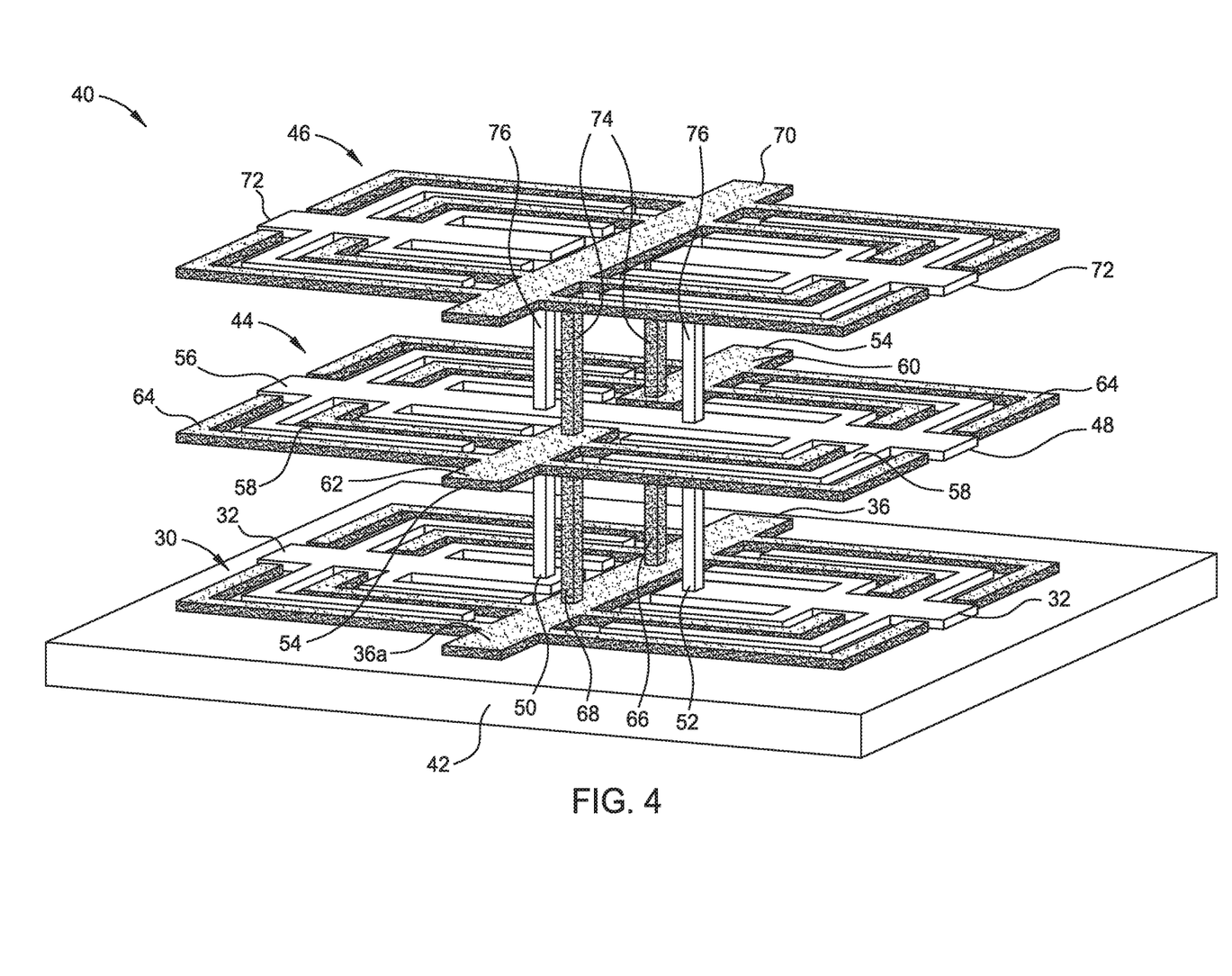
FIG. 4 illustrates multiple layers of MoM capacitor, each layer having two different electrical conductors with orthogonally-arranged conductive arteries and orthogonally-oriented conductive fingers, according to aspects presented herein.

FIG. 4 illustrates an exemplary three-dimensional representation of a MoM capacitor 40 having a plurality of layers having two different electrical conductors with orthogonally-arranged conductive arteries and orthogonally-oriented conductive fingers, according to certain aspects presented herein. According to aspects, the MoM capacitor 40 may be positioned on a substrate 42. In an aspect, the substrate 42 is a semiconductor material and may be part of a semiconductor die, which may include other semiconductive elements such as transistors, diodes, and the like. For simplicity, the MoM capacitor 40 is illustrated with only three layers 30, 44, and 46, although more layers may be provided, as desired. Likewise, in FIG. 4, other components of the layers 30, 44, and 46, such as transistors, are omitted for purposes of simplifying the illustration of the MoM capacitor 40.

Further, while not shown in FIG. 4, it should be noted that the MoM capacitor 40 may include dielectric or other electrically insulative layers disposed between each adjacent pair of metal layers to increase the capacitance between these metal layers and to provide structural support for the metal layers. For example, a first dielectric layer may be disposed between the metal layer 30 and the metal layer 44, and a second dielectric layer may be disposed between the metal layer 44 and the metal layer 46. As noted, dielectric layers are disposed between metal layers to establish a capacitance between these metal layers, Thus, the more metal layers, and dielectric layers disposed therebetween, that the MoM capacitor 40 includes, the larger the capacitance of the MoM capacitor 40 is.

As illustrated, the MoM capacitor 40 may include a first metal layer, such as the metal layer 30 illustrated in FIG. 3, and a second metal layer 44, which may be positioned adjacent to the first metal layer 30. According to aspects, a structure of the second metal layer 44 may be the same as a structure of the first metal layer 30 except that a structure of the first electrical conductor 32 in the metal layer 30 and a structure of the second electrical conductor 36 in the metal layer 30 are switched in the metal layer 44, as illustrated in FIG. 4.

According to aspects, the MoM capacitor 40 may also include a first plurality of vias disposed between the first metal layer 30 and the second metal layer 44, such that the first conductive artery 32a of the first electrical conductor 32 is electrically coupled to the second conductive artery 32b of the first electrical conductor 32, for example, by way of the second metal layer 44. For example, the second metal layer 44 may comprise a third electrical conductor 48 corresponding to, and in parallel with, the first electrical conductor 32. Thus, in some cases, the first plurality of vias comprises: (1) a first set of vias 50, coupled between the first conductive artery 32a of the first electrical conductor 32 and the third electrical conductor 48, and (2) a second set of vias 52, coupled between the second conductive artery 32b of the first electrical conductor 32 and the third electrical conductor 48.

Additionally, as illustrated in FIG. 4, the second metal layer 44 of the MoM capacitor 40 may include a fourth electrical conductor 54 corresponding to and in parallel with the second electrical conductor 36. According to aspects, the third electrical conductor 48 may include a fourth conductive artery 56 and a third plurality of conductive fingers 58 extending from the fourth conductive artery 56. Additionally, the fourth electrical conductor 54 may include a fifth conductive artery 60, a sixth conductive artery 62, and a fourth plurality of conductive fingers 64 extending from at least one of the fifth conductive artery 60 or the sixth conductive artery 62. According to aspects, conductive fingers of the fourth plurality of conductive fingers 64 may be interdigitated with conductive fingers of the third plurality of conductive fingers 58.

As illustrated, the fifth conductive artery 60 of the fourth electrical conductor 54 may be positioned adjacent to a first side of the fourth conductive artery 56 of the third electrical conductor 48. Additionally, the sixth conductive artery 62 of the fourth electrical conductor 54 may be positioned adjacent to a second side of the fourth conductive artery 56 of the third electrical conductor 48 opposite to the first side of the fourth conductive artery 56.

According to aspects, the MoM capacitor 40 may also include a second plurality of vias disposed between the first metal layer 30 and the second metal layer 44 such that the third conductive artery 36a of the second electrical conductor 36 is electrically coupled to the fifth conductive artery 60 and sixth conductive artery 62 of the fourth electrical conductor 54, for example, by way of the second metal layer 44. Thus, in some cases, the second plurality of vias comprises: (1) a third set of vias 66, coupled between the fifth conductive artery 60 of the fourth electrical conductor 54 and the second electrical conductor 36, and (2) a fourth set of vias 68, coupled between the sixth conductive artery 62 of the fourth electrical conductor 54 and the second electrical conductor 36.

Further, as illustrated in FIG. 4 and noted above, the MoM capacitor 40 may include a third metal layer 46. The third metal layer may be a duplicate of the first metal layer 30 in structure. According to aspects, the third metal layer may comprise a fifth electrical conductor 70, corresponding to and in parallel with the fourth electrical conductor 54, and a sixth electrical conductor 72. According to aspects, the MoM capacitor 40 may comprise a third plurality of vias 74 disposed between the second metal layer 44 and the third metal layer 46 such that the fifth conductive artery 60 and sixth conductive artery 62 of the fourth electrical conductor 54 are electrically coupled to the fifth electrical conductor 70, for example, by way of the third metal layer 46. Additionally, the MoM capacitor 40 may comprise a fourth plurality of vias 76 disposed between the second metal layer 44 and the third metal layer 46 such that the fourth conductive artery 56 of the third electrical conductor 48 are electrically coupled to the sixth electrical conductor 72, for example, by way of the third metal layer 46.

It should be noted that while FIG. 4 illustrates specific locations of the vias interconnecting the electrical conductors of the metal layers of the MoM capacitor, these vias may be placed anywhere along their respective electrical conductors.

Figure 5:
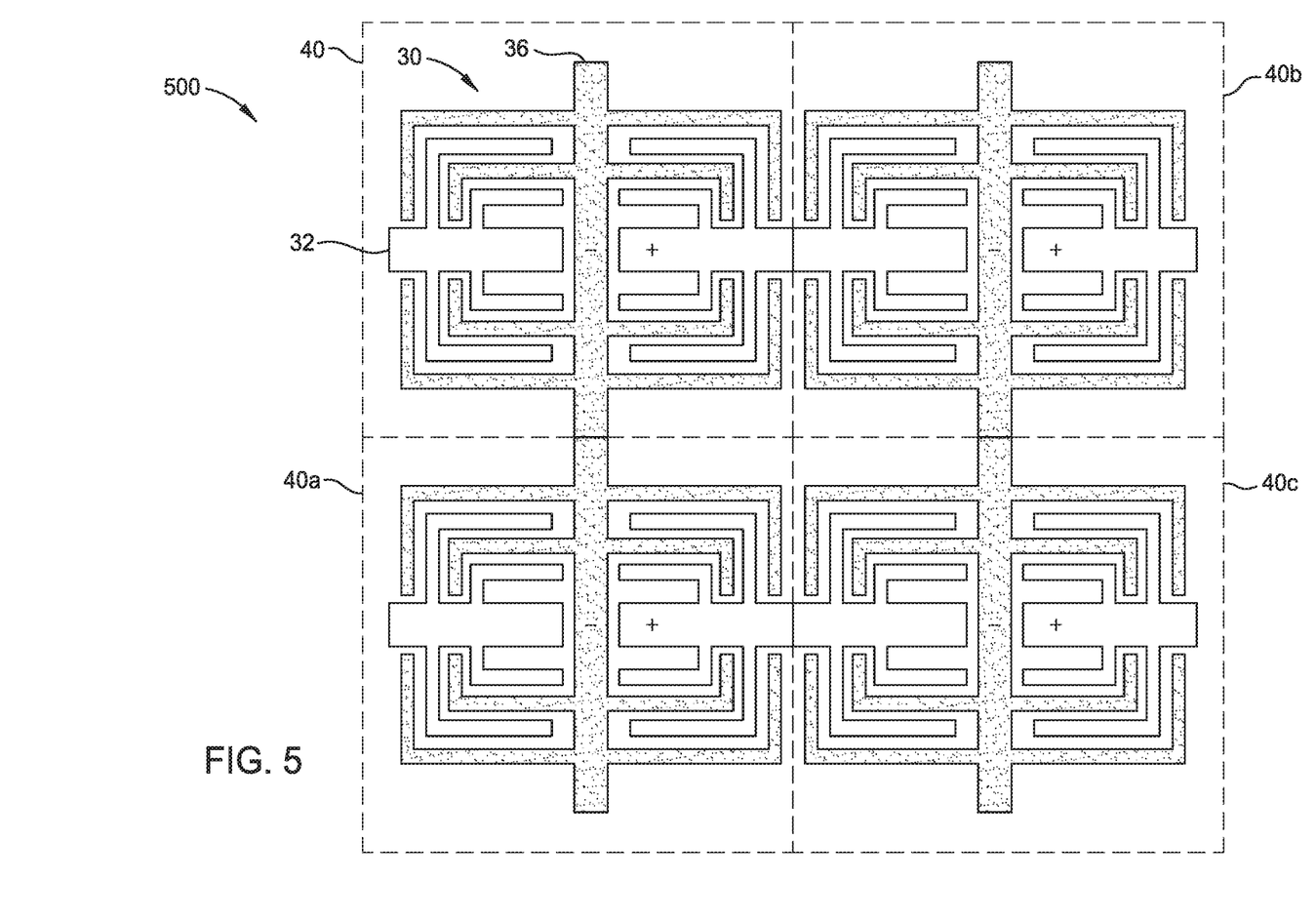
FIG. 5 illustrates an example array structure for a MoM capacitor, according to aspects presented herein.

FIG. 5 illustrates an example array structure 500 for one example layer of a MoM capacitor, according to aspects presented herein. As illustrated, the array structure 500 may comprise a number of interconnected MoM capacitors 40, 40a, 40b, and 40c. For example, as illustrated, the electrical conductors 32 and 36 of the metal layer 30 of the MoM capacitor 40 may be coupled with corresponding electrical conductors of a metal layer of a MoM capacitor 40a and a MoM capacitor 40b. Similarly, the electrical conductors of the MoM capacitor 40a may be coupled with the corresponding electrical conductors of MoM capacitor 40c. Further, as illustrated, the electrical conductors of the MoM capacitor 40c may also be coupled with the corresponding electrical conductors of the MoM capacitor 40b, such that the array structure 500 is formed as illustrated in FIG. 5. It should be noted that while FIG. 5 shows four MoM capacitors in the array structure 500, the array structure 500 may include any number of MoM capacitors. Additionally, while FIG. 5 generally illustrates the array structure 500 as including multiple discrete MoM capacitors for ease in understanding, it should be understood that the array structure 500 may include a single MoM capacitor with the two different electrical conductors arranged as shown in FIG. 5.

The MoM capacitor 40 according to aspects described herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
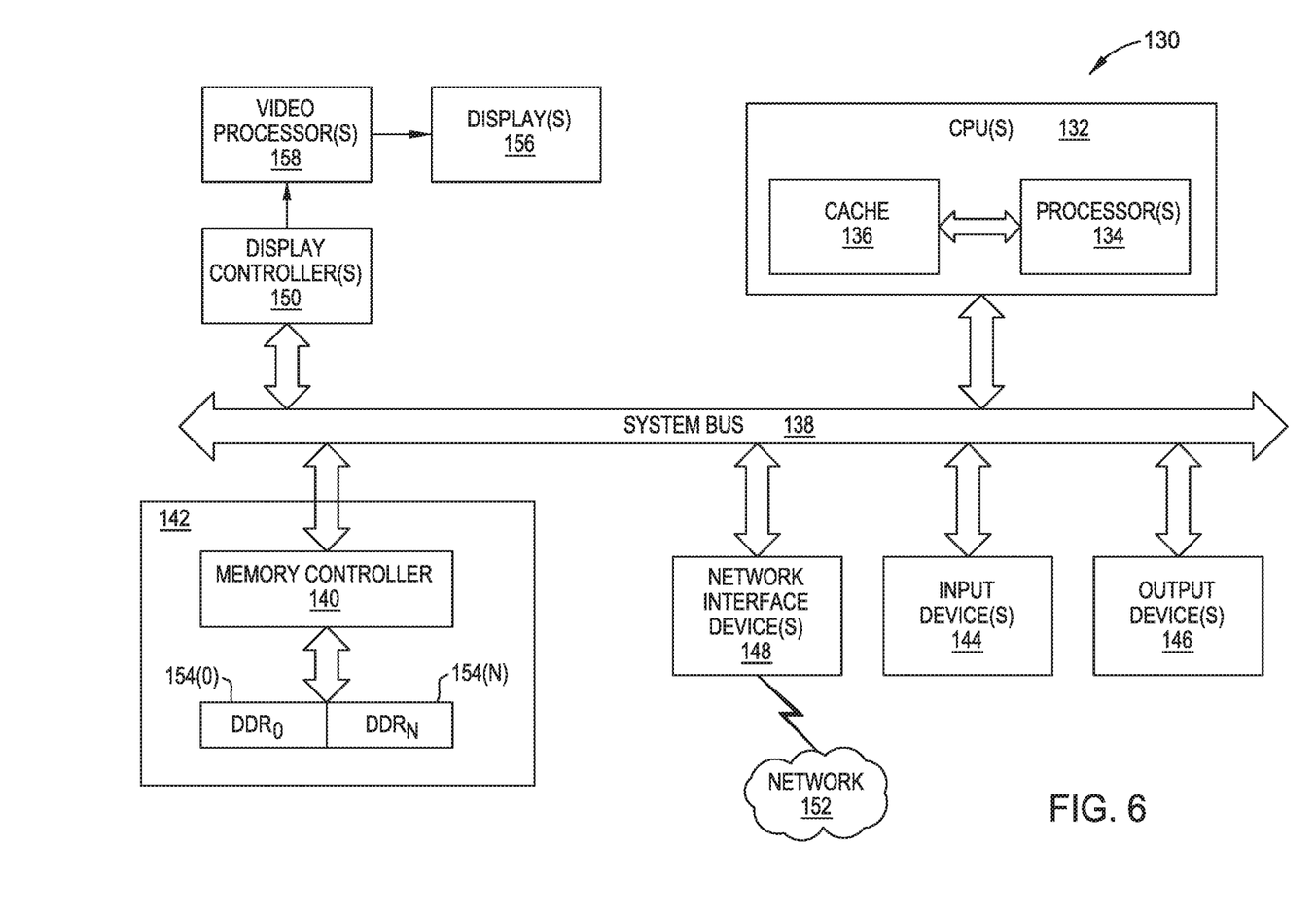
FIG. 6 is a block diagram of an exemplary processor-based system that can include a MoM capacitor, according to aspects presented herein.

In this regard, FIG. 6 illustrates an example of a processor-based system 130 that can employ the MoM capacitors illustrated in FIGS. 3-5. In this example, the processor-based system 130 includes one or more central processing units (CPUs) 132, each including one or more processors 134. The CPU(s) 132 may have cache memory 136 coupled to the processor(s) 134 for rapid access to temporarily stored data. The CPU(s) 132 is coupled to a system bus 138 and can intercouple master devices and slave devices included in the processor-based system 130. As is well known, the CPU(s) 132 communicates with these other devices by exchanging address, control, and data information over the system bus 138. For example, the CPU(s) 132 can communicate bus transaction requests to the memory controller 140.

Other master and slave devices can be connected to the system bus 138. As illustrated in FIG. 6, these devices can include a memory system 142, one or more input devices 144, one or more output devices 146, one or more network interface devices 148, and one or more display controllers 150, as examples. The input device(s) 144 can include any type of input device, including but not limited to input keys, switches, voice processors, etc. The output device(s) 146 can include any type of output device, including but not limited to audio, video, other visual indicators, etc. The network interface device(s) 148 can be any devices configured to allow exchange of data to and from a network 152. The network 152 can be any type of network, including but not limited to a wired or wireless network, private or public network, a local area network (LAN), a wide local area network (WLAN), and the Internet. The network interface device(s) 148 can be configured to support any type of communication protocol desired. The memory system 142 can include one or more memory units 154(0-N).

The CPU(s) 132 may also be configured to access the display controller(s) 150 over the system bus 138 to control information sent to one or more displays 156. The display controller(s) 150 sends information to the display(s) 156 to be displayed via one or more video processors 158, which process the information to be displayed into a format suitable for the display(s) 156. The display(s) 156 can include any type of display, including but not limited to a cathode ray tube (CRT), a liquid crystal display (LCD), a plasma display, etc.

Figure 7:
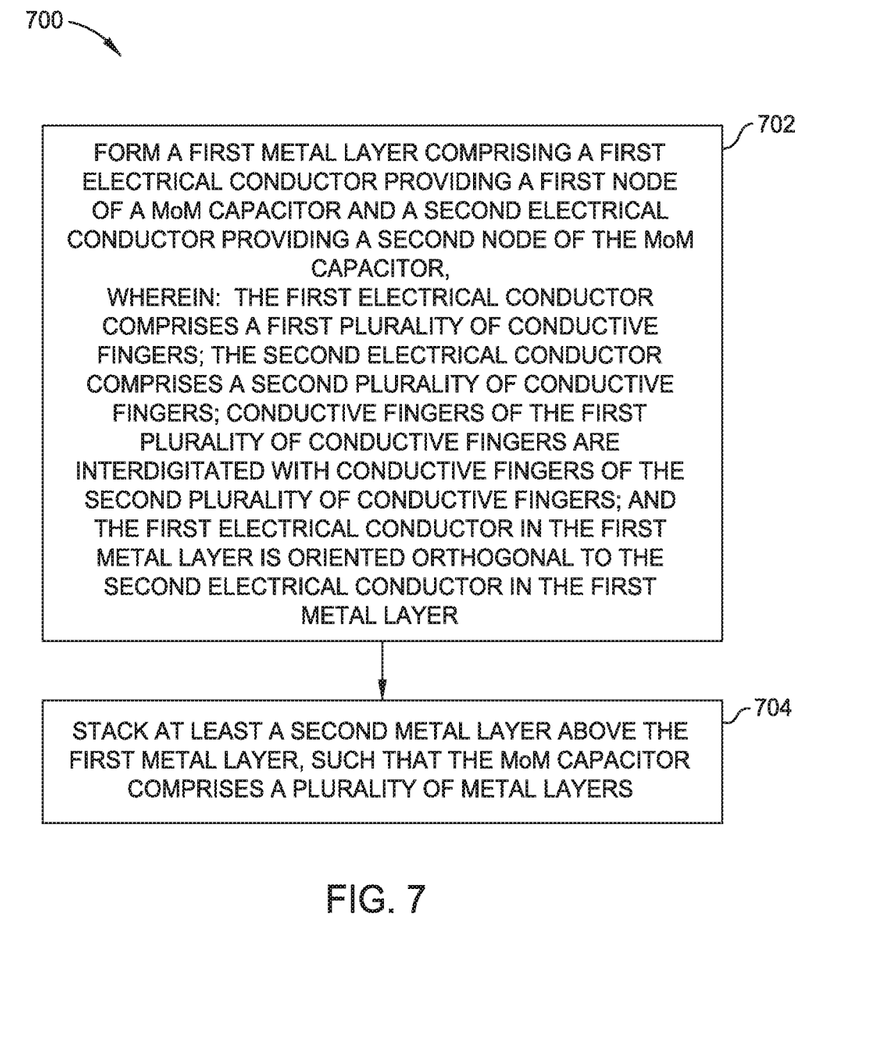
FIG. 7 is a flow diagram of exemplary operations for fabricating a MoM capacitor, according to aspects presented herein.

FIG. 7 is a flow diagram illustrating example operations 700 for fabricating a metal-on-metal (MoM) capacitor having two different electrical conductors with orthogonally-arranged conductive arteries and orthogonally-oriented conductive fingers, according to aspects described herein.

Operations 700 begin at block 702 by forming a first metal layer comprising a first electrical conductor providing a first node of the MoM capacitor and a second electrical conductor providing a second node of the MoM capacitor. According to aspects and as noted above, the first electrical conductor comprises a first plurality of conductive fingers and the second electrical conductor comprises a second plurality of conductive fingers. Further, according to aspects, the conductive fingers of the first plurality of conductive fingers are interdigitated with conductive fingers of the second plurality of conductive fingers. Additionally, the first electrical conductor in the first metal layer is oriented orthogonal to the second electrical conductor in the first metal layer. At block 704, forming the MoM capacitor includes stacking at least a second metal layer above the first metal layer, such that the MoM capacitor comprises a plurality of metal layers. As noted, a structure of the second metal layer may be the same as a structure of the first metal layer except that a structure of the first electrical conductor in the first metal layer and a structure of the second electrical conductor in the first metal layer are switched in the second metal layer.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

The invention claimed is:

1. A metal-on-metal (MoM) capacitor comprising:
a plurality of metal layers, wherein a first metal layer in the plurality of metal layers comprises a first electrical conductor providing a first node of the MoM capacitor and a second electrical conductor providing a second node of the MoM capacitor, wherein:
the first electrical conductor comprises a first plurality of conductive fingers;
the second electrical conductor comprises a second plurality of conductive fingers;
conductive fingers of the first plurality of conductive fingers are interdigitated with conductive fingers of the second plurality of conductive fingers;
the first electrical conductor in the first metal layer is oriented orthogonal to the second electrical conductor in the first metal layer;
the first electrical conductor includes a first artery and a second artery;
the first plurality of conductive fingers extends from at least one of the first artery or the second artery;
one or more pairs of the first plurality of conductive fingers extending from different sides of the at least one of the first artery or the second artery are C-shaped;
the second electrical conductor includes a third artery;
the second plurality of conductive fingers extends from the third artery;
one or more pairs of the second plurality of conductive fingers extending from different sides of the third artery are C-shaped; and
the one or more pairs of the second plurality of conductive fingers that are C-shaped are oriented orthogonal to the one or more pairs of the first plurality of conductive fingers that are C-shaped.

2. The MoM capacitor of claim 1, wherein the first plurality of conductive fingers of the first electrical conductor comprises:
a first set of conductive fingers, wherein the first set of conductive fingers extends from a first side of the first artery and wherein one or more of the conductive fingers in the first set are L-shaped; and
a second set of conductive fingers, wherein the second set of conductive fingers extends from a second side of the first artery, opposite to the first side of the first artery, and wherein one or more of the conductive fingers in the second set are L-shaped.

3. The MoM capacitor of claim 2, wherein the first plurality of conductive fingers of the first electrical conductor further comprises:
a third set of conductive fingers; and
a fourth set of conductive fingers, wherein the third set of conductive fingers and the fourth set of conductive fingers extend from the second artery to form a mirror image of the first artery, the first set of conductive fingers, and the second set of conductive fingers.

4. The MoM capacitor of claim 1, wherein the second plurality of conductive fingers of the second electrical conductor comprises:
a first set of conductive fingers, wherein the first set of conductive fingers extends from a first side of the third artery and wherein one or more of the conductive fingers in the first set are L-shaped; and
a second set of conductive fingers, wherein the second set of conductive fingers extends from a second side of the third artery, opposite to the first side of the third artery, and wherein one or more of the conductive fingers in the second set are L-shaped.

5. The MoM capacitor of claim 4, wherein the second plurality of conductive fingers of the second electrical conductor further comprises:
a third set of conductive fingers extending from the first side of the third artery; and
a fourth set of conductive fingers extending from the second side of the third artery, wherein the third set of conductive fingers and the fourth set of conductive fingers extend from the third artery to form a mirror image of the first set of conductive fingers and the second set of conductive fingers respectively.

6. The MoM capacitor of claim 1, wherein:
the first artery of the first electrical conductor is positioned adjacent to a first side of the third artery of the second electrical conductor; and
the second artery of the first electrical conductor is positioned adjacent to a second side of the third artery of the second electrical conductor opposite to the first side.

7. The MoM capacitor of claim 6, wherein:
the plurality of metal layers comprises a second metal layer; and
the MoM capacitor further comprises a first plurality of vias disposed between the first metal layer and the second metal layer such that the first artery of the first electrical conductor is electrically coupled to the second artery of the first electrical conductor.

8. The MoM capacitor of claim 7, wherein the second metal layer is positioned adjacent to the first metal layer.

9. The MoM capacitor of claim 7, wherein:
the second metal layer comprises a third electrical conductor corresponding to and in parallel with the first electrical conductor; and
the first plurality of vias comprises:
a first set of vias coupled between the first artery of the first electrical conductor and the third electrical conductor; and a second set of vias coupled between the second artery of the first electrical conductor and the third electrical conductor.

10. The MoM capacitor of claim 9, wherein the second metal layer further comprises a fourth electrical conductor corresponding to and in parallel with the second electrical conductor.

11. The MoM capacitor of claim 10, wherein:
the third electrical conductor includes a fourth artery and a third plurality of conductive fingers extending from the fourth artery; and
the fourth electrical conductor includes a fifth artery, a sixth artery, and a fourth plurality of conductive fingers extending from at least one of the fifth artery or the sixth artery.

12. The MoM capacitor of claim 11, wherein:
the fifth artery of the fourth electrical conductor is positioned adjacent to a first side of the fourth artery of the third electrical conductor; and
the sixth artery of the fourth electrical conductor is positioned adjacent to a second side of the fourth artery of the third electrical conductor opposite to the first side of the fourth artery.

13. The MoM capacitor of claim 11, wherein:
the plurality of metal layers comprises a third metal layer; and
the MoM capacitor further comprises a second plurality of vias disposed between the second metal layer and the third metal layer such that the fifth artery of the fourth electrical conductor is electrically coupled to the sixth artery of the fourth electrical conductor.

14. The MoM capacitor of claim 13, wherein:
the third metal layer comprises a fifth electrical conductor corresponding to and in parallel with the fourth electrical conductor; and
the second plurality of vias comprises:
a third set of vias coupled between the fifth artery of the fourth electrical conductor and the fifth electrical conductor; and
a fourth set of vias coupled between the sixth artery of the fourth electrical conductor and the fifth electrical conductor.

15. The MoM capacitor of claim 11, wherein a longitudinal axis of the fourth artery is orthogonal to a longitudinal axis of at least one of the fifth artery or the sixth artery.

16. The MoM capacitor of claim 1, wherein the first node is a positive node of the MoM capacitor and wherein the second node is a negative node of the MoM capacitor.

17. The MOM capacitor of claim 1, wherein the third artery is disposed between and separates the first artery and the second artery and wherein a longitudinal axis of the third artery is oriented orthogonal to a longitudinal axis of at least one of the first artery or the second artery.

18. A metal-on-metal (MoM) capacitor comprising:
a first metal layer comprising a first electrical conductor providing a first node of the MoM capacitor and a second electrical conductor providing a second node of the MoM capacitor, wherein:
the first electrical conductor comprises a first plurality of conductive fingers;
the second electrical conductor comprises a second plurality of conductive fingers;
conductive fingers of the first plurality of conductive fingers are interdigitated with conductive fingers of the second plurality of conductive fingers;
the first electrical conductor in the first metal layer is oriented orthogonal to the second electrical conductor in the first metal layer;
the first electrical conductor includes a first artery and a second artery;
the first plurality of conductive fingers extends from at least one of the first artery or the second artery;
the second electrical conductor includes a third artery;
the second plurality of conductive fingers extends from the third artery;
the first artery of the first electrical conductor is positioned adjacent to a first side of the third artery of the second electrical conductor; and
the second artery of the first electrical conductor is positioned adjacent to a second side of the third artery of the second electrical conductor opposite to the first side; and
a second metal layer comprising a third electrical conductor corresponding to and in parallel with the first electrical conductor and a fourth electrical conductor corresponding to and in parallel with the second electrical conductor, wherein:
the third electrical conductor includes a fourth artery and a third plurality of conductive fingers extending from the fourth artery; and
the fourth electrical conductor includes a fifth artery, a sixth artery, and a fourth plurality of conductive fingers extending from at least one of the fifth artery or the sixth artery.

19. The MOM capacitor of claim 18, further comprising a first plurality of vias disposed between the first metal layer and the second metal layer such that the first artery of the first electrical conductor is electrically coupled to the second artery of the first electrical conductor, wherein the first plurality of vias comprises:
a first set of vias coupled between the first artery of the first electrical conductor and the third electrical conductor; and
a second set of vias coupled between the second artery of the first electrical conductor and the third electrical conductor.

20. The MOM capacitor of claim 18, wherein one or more pairs of the first plurality of conductive fingers extending from different sides of the at least one of the first artery or the second artery are C-shaped.

* * * * *